United States Patent [19]
Yasuhiro

[11] Patent Number: 5,703,830
[45] Date of Patent: Dec. 30, 1997

[54] SYNCRONOUS DYNAMIC SEMICONDUCTOR MEMORY DEVICE USING PIPELINED MULTI-BIT PREFETCH ARCHITECTURE

[75] Inventor: Takai Yasuhiro, Tokyo, Japan

[73] Assignee: NEC Corporation, Tokyo, Japan

[21] Appl. No.: 701,879

[22] Filed: Aug. 23, 1996

[30] Foreign Application Priority Data

Aug. 25, 1995 [JP] Japan .................................. 7-240902

[51] Int. Cl.⁶ ........................................... G11C 8/00
[52] U.S. Cl. ............... 365/233; 365/230.06; 365/189.05; 365/236
[58] Field of Search ..................... 365/233, 236, 365/230.06, 205, 230.08, 189.05

[56] References Cited

U.S. PATENT DOCUMENTS

| | | | |
|---|---|---|---|
| 5,384,737 | 1/1995 | Childs et al. | 365/189.05 |
| 5,610,874 | 3/1997 | Park et al. | 365/236 |
| 5,633,834 | 5/1997 | Pascucci | 365/233 |

*Primary Examiner*—David C. Nelms
*Assistant Examiner*—Huan Hoang

[57] ABSTRACT

In a synchronous dynamic semiconductor memory device, a plurality of data paths, each of which is formed by a column decoder, a sense amplifier and a first-stage data amplifier, are provided between a column address buffer having a burst counter function and a second-stage data amplifier which is further connected to a data latch circuit.

4 Claims, 9 Drawing Sheets ns, thus effectively transferring the data therethrough.

SYNCRONOUS DYNAMIC SEMICONDUCTOR MEMORY DEVICE USING PIPELINED MULTI-BIT PREFETCH ARCHITECTURE

BACKGROUND OF THE INVENTION

1. Field of the Invention

The present invention relates to a synchronous dynamic random access memory (DRAM) device, and more particularly, to a synchronous DRAM device using a pipelined multi-bit profetch architecture.

2. Description of the Related Art

In a first prior art synchronous DRAM device, a 3-stage architecture using a frequency of 100 mHz foe a clock signal is adopted to realize a column access strobe (CAS) latency of 3 cycles (see: Y. Takai et al., "250 Mbyte/s Synchronous DRAM Using a 3-Stage-Pipelined Architecture", IEEE Journal of Solid-State Circuits, Vol. 29, No. 4, pp. 426–431, April 1994). That is, after three clock cycles have passed after a read command is issued, data of a column address generated simultaneously with the read command is generated. This will be explained later in detail.

In the above-mentioned first prior art synchronous DRAM device, however, the access time is still large.

In a second prior art synchronous DRAM device, a two-bit prefetch architecture is adopted. That is, two data paths, each of which is formed by a column decoder, a sense amplifier, a first-stage data amplifier and a second-stage data amplifier are provided between a column address buffer having a burst counter function and a data latch circuit (see: Y. Choi et al., "16-Mb Synchronous DRAM with 125-Mbyte/s Data Rate", IEEE Journal of Solid-State Circuits, Vol. 29, No. 4, pp. 529–533, April 1994). This will also be explained later in detail.

In the above-mentioned second prior art synchronous DRAM device, however, since a two-way configuration is also adopted for the second-stage data amplifier, the chip area is increased which reduces the integration.

SUMMARY OF THE INVENTION

It is an object of the present invention to provide a synchronous DRAM device having a small access time as well as a high integration.

According to the present invention, in a synchronous DRAM device, a plurality of data paths, each of which is formed by a column decoder, a sense amplifier and a first-stage data amplifier are provided between a column address buffer having a burst counter function and a second-stage data amplifier which is further connected to a data latch circuit.

Thus, since a two-way architecture is not adopted for the second-stage data amplifier, the intergration can be increased without increasing the access time.

BRIEF DESCRIPTION OF THE DRAWINGS

The present invention will be more clearly understood from the description as set forth below, in comparison with the prior art, with reference to the accompanying drawings, wherein.

DESCRIPTION OF THE PREFERRED EMBODIMENT

Before the description of the preferred embodiment, prior art synchronous DRAM devices will be explained with reference to FIGS. 1, 2A through 2I, 3 and 4A through 4L.

Figure 1:
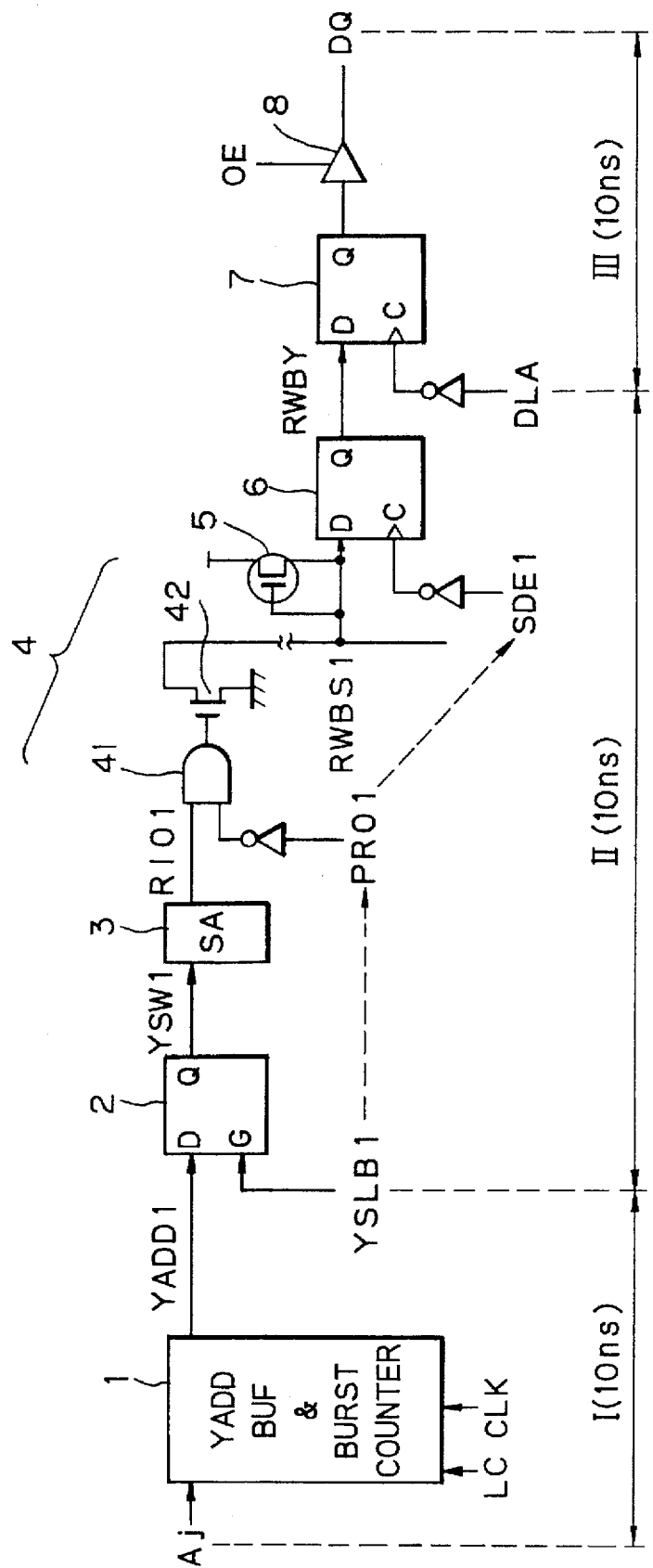
FIG. 1 is a circuit diagram illustrating a first prior art synchronous DRAM device.

In FIG. 1, which illustrates a first prior art synchronous DRAM device (see: Y. Takai et al., "250 Mbyte/s Synchronous DRAM Using a 3-Stage-Pipelined Architecture", IEEE Journal of Solid-State Circuits, Vol. 29, No. 4, pp. 426–431, April 1994), three-stages I, II and III are pipelined.

The first stage I is comprised of a column address buffer including a burst counter for generating a column address signal YADD1.

The second stage II is comprised of a column decoder 2 for decoding the column address signal YADD1 in synchronization with a clock signal YSLB1 to generate a column switch signal YSW1 for selecting one of bit lines connected to memory cells (not shown), Also, a sense amplifier 3 amplifies a voltage at the selected bit line to generate a voltage at a read bus RIO1, Further, a first-stage data amplifier 4 formed by an AND circuit 41 and an N-channel MOS transistor 42 amplifies the voltage at the read bus RIO1 to generate a voltage at a read/write bus RWBS1 in synchronization with a control signal PRO1. Note that a p-channel MOS transistor 5 is used as a pull-up resistance for pulling up the voltage at the read/write bus RWBS1, Further, a second-stage data amplifier 6 amplifies the voltage at the read/write bus RWBS1 and transmits its amplified voltage to a read/write bus RWBY in synchronization with a control signal SDE1.

The third stage III is comprised of a data latch circuit 7 and a buffer circuit 8. The data latch circuit 7 latches the voltage at the read/write bus RWBY in synchronization with a control signal DLA, The buffer circuit 8 is enabled (in a low impedance state) or disabled (in a high impedance state) by an output enable signal OE.

Each of the stages I, II and III transmits data by about 10 ns, thus effectively transferring the data therethrough.

The operation of the synchronous DRAM device of FIG. 1 is explained next with reference to FIGS. 2A through 2I.

Figure 2:
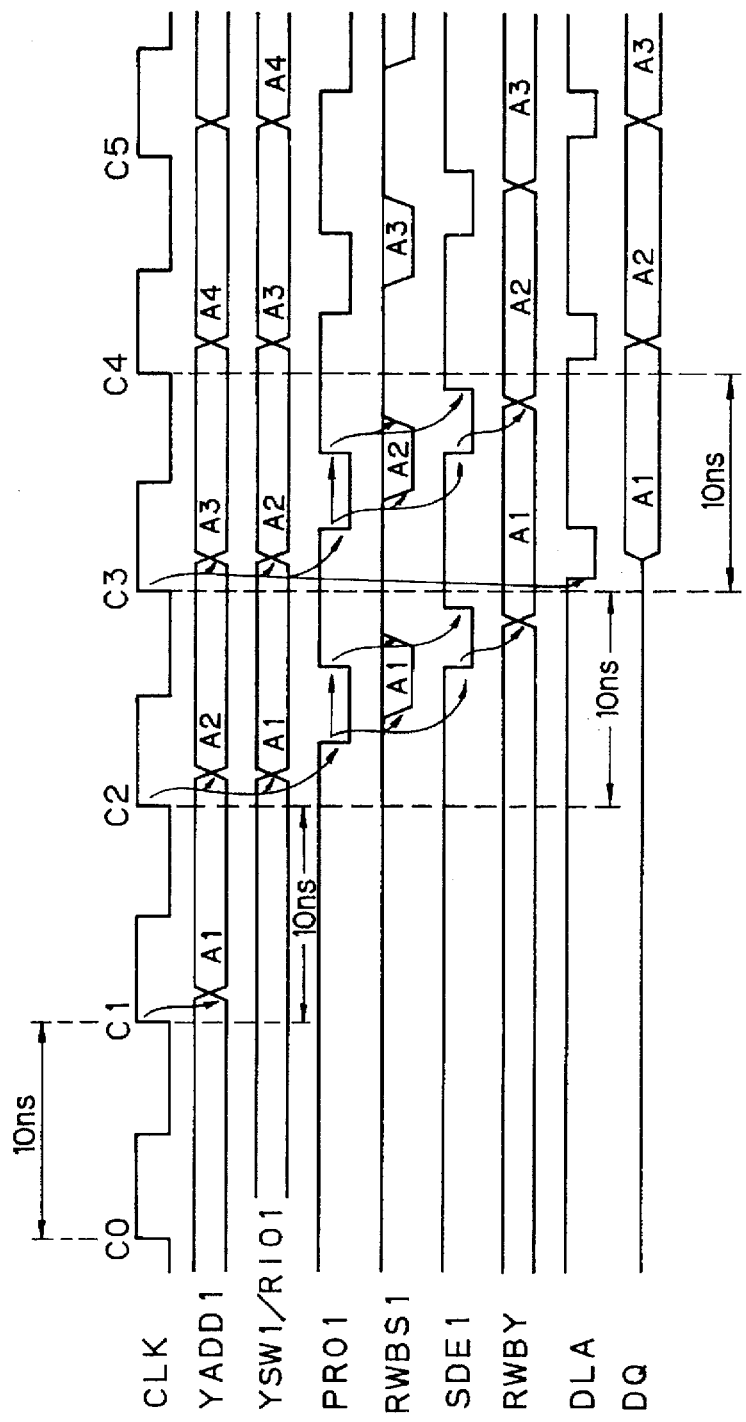
FIGS. 2A through 2I are timing diagrams showing the operation of the device of FIG. 1.

That is, a latch enable signal LC (not shown) and a clock signal CLK having a time, period of 10 ns as shown in FIG. 2A are supplied to the column address buffer 1. As a result, the column address buffer 1 latches an address A1 based upon a column address signal Aj in response to a clock cycle C1 as shown in FIG. 2B. Further, the burst counter of the column address buffer 1 increments the value of the address signal YADD1 such as A2, A3, A4, . . . , as shown in FIG. 2B.

The clock signal YSLB1 is changed in response to clock cycles C2, C3, C4, C5, . . . of the clock signal CLK. Therefore, as shown in FIG. 2C, the column switch signal YSW1 and the read bus RIO1 are operated to correspond to the values A1, A2, A3, A4, . . . in response to clock cycles C2, C3, C4, C5, . . . .

Further, as shown in FIG. 2D, the clock signal PRO1 is changed in response to clock cycles C2, C3, C4, C5, . . . of the clock signal CLK. Therefore, the voltage of the read/write bus RWBS1 is changed by the first-stage data amplifier 4 as shown in FIG. 2E.

In addition, as shown in FIG. 2F, the control signal SDE1 is changed in response to the control signal PRO1. Therefore, the voltage of the read/write bus RWBY is changed by the second-stage data amplifier 6 as shown in FIG. 2G.

Further, as shown in FIG. 2H, the clock signal DLA is changed in response to clock cycles C3, C4, C5, . . . of the clock signal CLK. Therefore, the voltage of the read/write bus RWBY is latched by the data latch circuit 7. Then, the latched voltage of the data latch circuit 7 is output via the output enable circuit 8 as shown in FIG. 2I.

Thus, in FIG. 1, asynchronous DRAM device having a CAS latency of 3 cycles can be realized. If the frequency of the clock signal CLK is 100 MHz, a time corresponding to an access time of a DRAM device is $$3 \times 10 \text{ ns} = 30 \text{ ns}. \tag{1}$$

Figure 3:
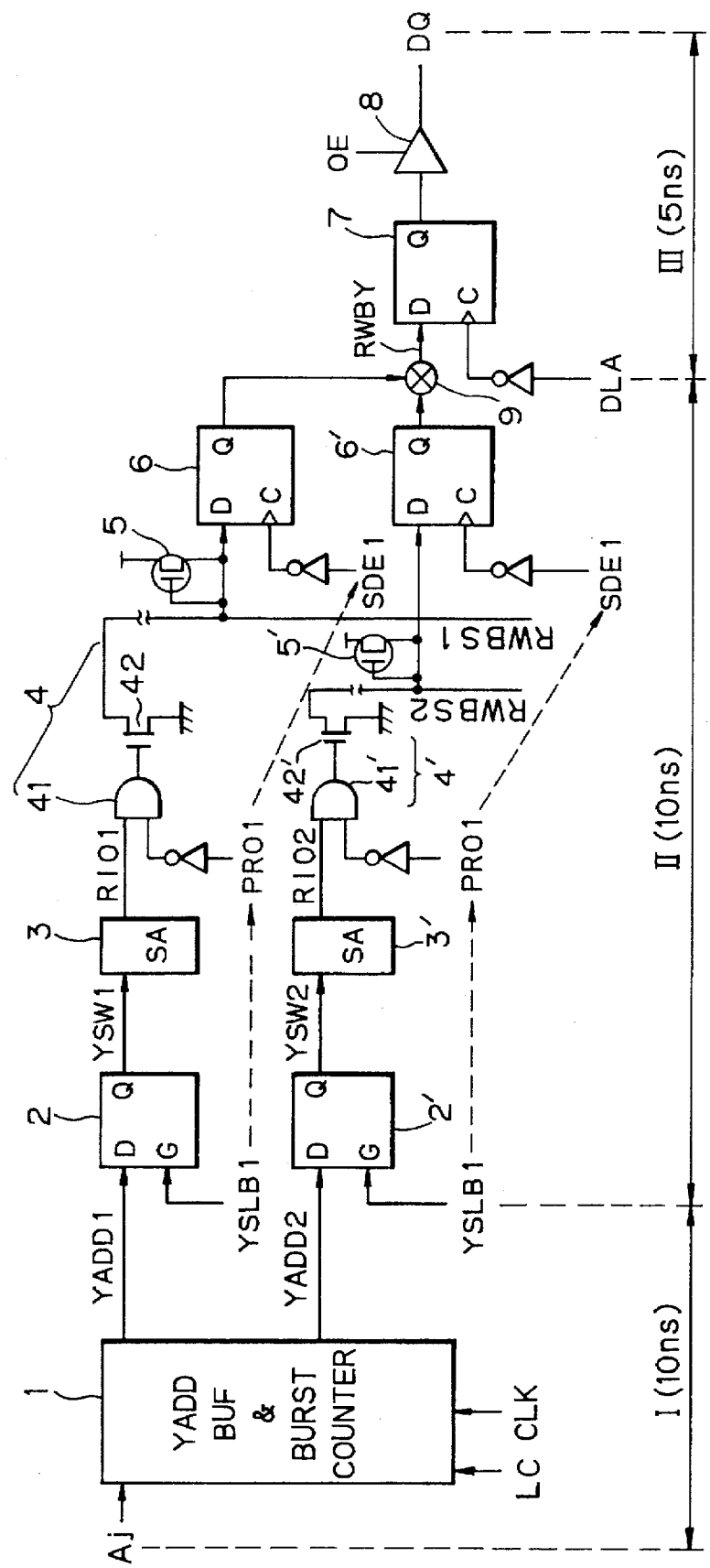
FIG. 3 is a circuit diagram illustrating a second art synchronous DRAM device.

In FIG. 3, which illustrates a second prior art synchronous DRAM device, a two-bit prefetch architecture is applied to the synchronous DRAM device of FIG. 1. For this purpose, a two-way configuration is established between the column address buffer 1 and the data latch circuit 7 of FIG. 1. That is, a column decoder 2', a sense amplifier 3', a first-stage data amplifier 4' formed an AND circuit 41' and an N-channel MOS transistor 42', a pull-up P-channel MOS transistor 5' and a second-stage data amplifier 6' are additionally provided between the column address buffer 1 and the data latch circuit 7 of FIG. 1. In this case, the two second-stage data amplifiers 6 and 6' are connected via a switch 9 to the data latch circuit 7.

The operation of the synchronous DRAM device of FIG. 3 is explained next with reference to FIGS. 4A through 4I.

Figure 4:
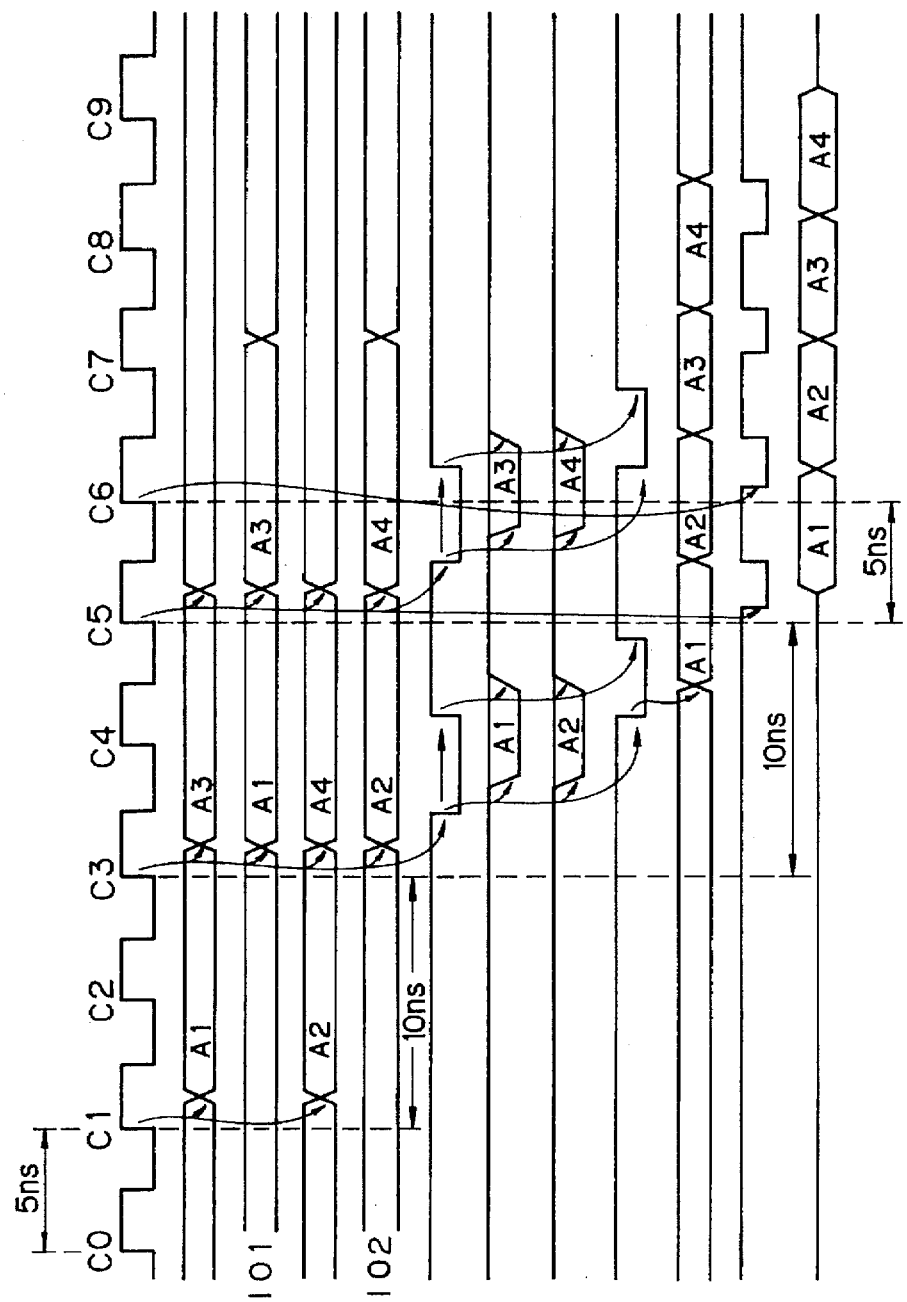
FIGS. 4A through 4L are timing diagrams showing the operation of the device of FIG. 3.

That is, a latch enable signal LC (not shown) and a clock signal CLK having a time period of 5 ns as shown in FIG. 4A are supplied to the column address buffer 1. As a result, the column address buffer 1 latches an address A1 based upon a column address signal Aj in response to a clock cycle C1 as shown in FIG. 4B, Thus, the column address buffer 1 generates the address A1 as the address signal YADD1. Simultaneously, the burst counter of the column address buffer 1 increments the address from A1 to A2 and generates the address A2 as an address signal YADD2 as shown in FIG. 4D.

Further, the burst counter of the column address buffer 1 increments the value of the address signal YADD1 such as A3, A5, . . . by +2 in response to clock cycles C3, C5, . . . , as shown in FIG. 4B, and the burst counter of the column address buffer 1 increments the value of the address signal ADD2 such as A4, A6, . . . by +2 in response to clock cycles C3, C5, . . . , as shown in FIG. 4D.

The clock signal YSLB1 is changed in response to clock cycles C3, C5, . . . of the clock signal CLK. Therefore, as shown in FIG. 4C, the column switch signal YSW1 and the read bus RIO1 are operated to correspond to the values A1, A3, . . . in response to, clock cycles C3, C5, . . . of the clock signal CLK. Also, as shown in FIG. 4E, the column switch signal YSW2 and the read bus RIO1 are operated to correspond to the values A2, A4, . . . in response to clock cycles C3, C5, . . . of the clock signal CLK.

Further, as shown in FIG. 4F, the clock signal PRO1 is changed in response to clock cycles C3, C5, . . . of the clock signal CLK. Therefore, the voltage of the read/write bus RWBS1 is changed by the first-stage data amplifier 4 as shown in FIG. 4G, and the voltage of the read/write bus RWBS2 is changed by the first-stage data amplifier 4' as shown in FIG. 4H.

In addition, as shown in FIG. 4I, the control signal SDE1 is changed in response to the control signal PRO1, and the switch 9 is controlled by a control signal having a frequency twice that of the control signal SDE1.

Therefore, the voltage of the read/write bus RWBY is changed as shown in FIG. 4J.

Further, as shown in FIG. 4K, the control signal DLA is changed in response to clock cycles C5, C6, C7, . . . of the clock signal CLK. Therefore, the voltage of the read/write bus RWBY is latched by the data latch circuit 7. Then, the latched voltage of the data latch circuit 7 is output via the output enable circuit 8 as shown in FIG. 4L.

Thus, in FIG. 3, asynchronous DRAM device having a CAS latency of 5 cycles can be realized. If the frequency of the clock signal CLK is 200 MHz, a time corresponding to an access time of a DRAM device is $$5 \times 5 \text{ ns} = 25 \text{ ns}. \tag{2}$$

In the device of FIG. 3, however, since the two-way configuration is adopted, the chip area is increased which reduces the integration.

Figure 5:
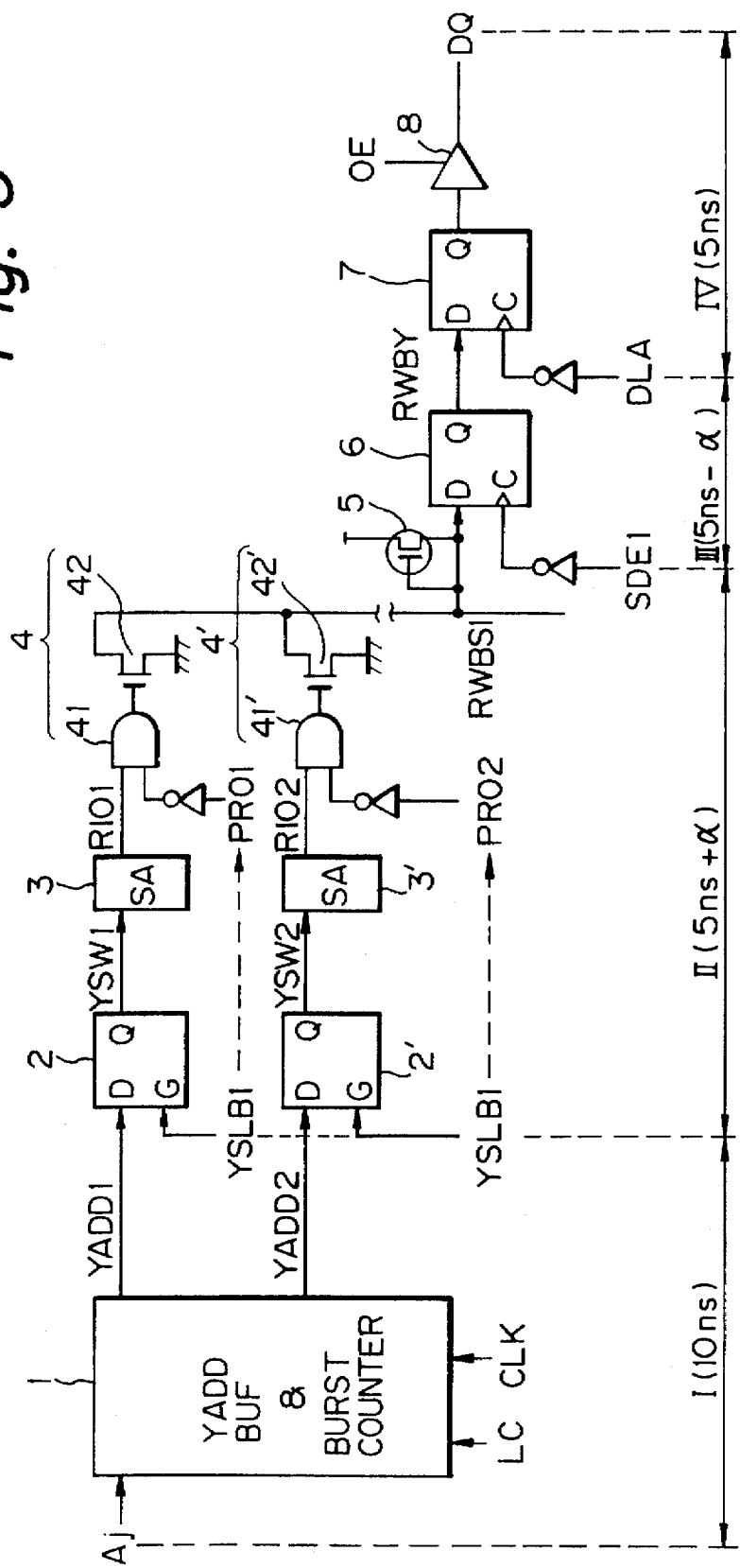
FIG. 5 is a circuit diagram illustrating an embodiment of the synchronous DRAM device according to the present invention.

In FIG. 5, which illustrates an embodiment of the present invention, a two-bit pro fetch architecture is also applied to the synchronous DRAM device of FIG. 1. For this purpose, a two-way configuration is established between the column address buffer 1 and the second-stage data amplifier 6 of FIG. 1. That is, a column decoder 2', a sense-amplifier 3', and a first-stage data amplifier 4' formed by an AND circuit 41' and an N-channel MOS transistor 42' are additionally provided between the column address buffer 1 and the second-stage data amplifier 6 of FIG. 1. In this case, four stages I, II, III and IV are pipelined. That is, the first stage I is comprised of the column address buffer 1; the second stage II is comprised of the decoders 2 and 2', the sense amplifiers 3 and 3', and the first-stage data amplifiers 4 and 4'; the third stage III is comprised of the second-stage data amplifier 6; and the fourth stage IV is comprised of the data latch circuit 7.

The operation of the synchronous DRAM device of FIG. 5 is explained next with reference to FIGS. 6A through 6L.

As shown in FIGS. 6A, 6B, 6C, 6E, 6F and 6G, the column address buffer 1, the decoder; 2 and 2' the sense amplifiers 3 operate in the same way as those in FIG. 3.

Figure 6:
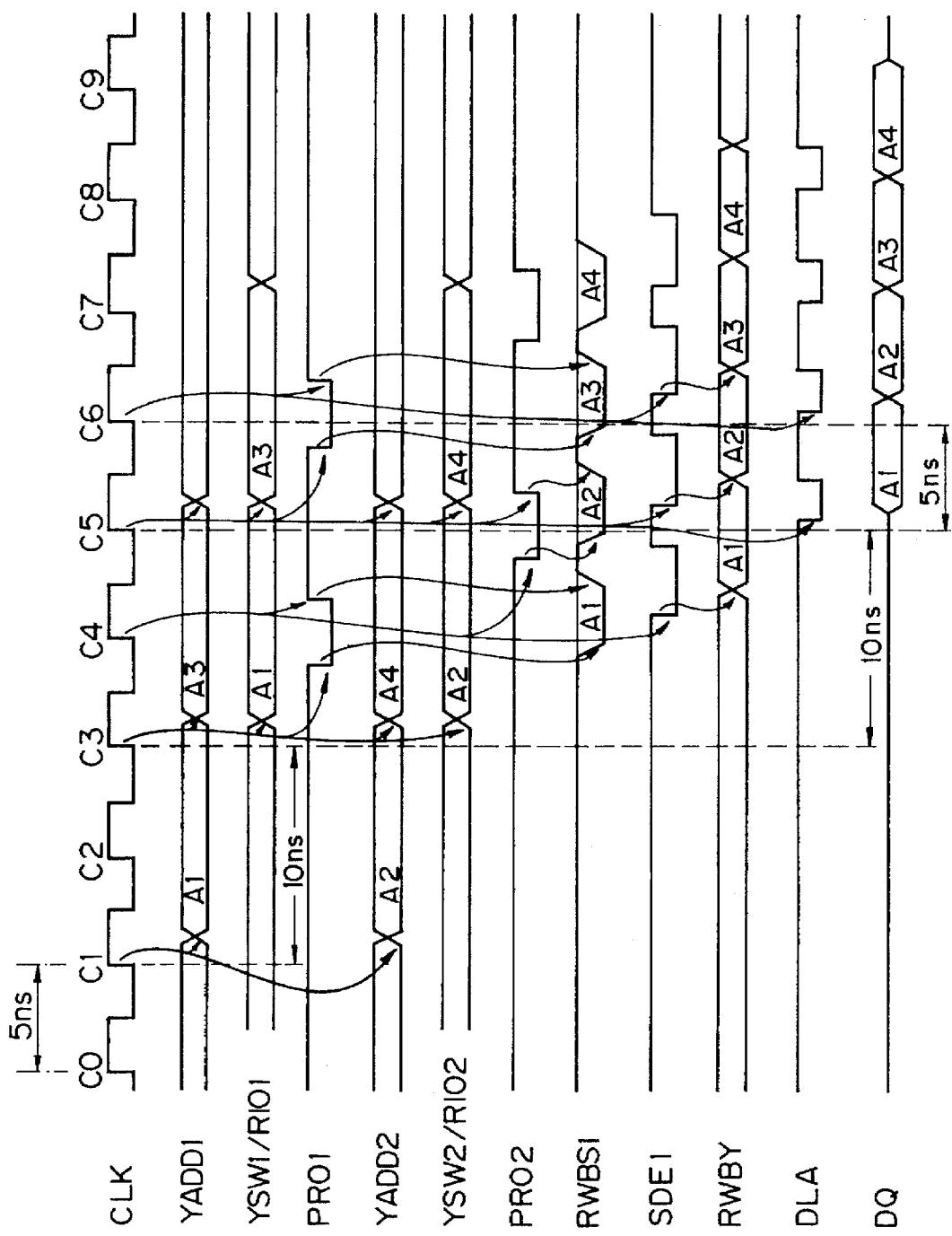
FIGS. 6A through 6L are timing diagrams showing the operation of the device of FIG. 5.

Also, as shown in FIGS. 6D and 6G, although the control signals PRO1 and PRO2 are changed for every two clock cycles, the control signals PRO1 and PRO2 are shifted from each other by one clock cycle. As a result, as shown in FIGS. 6C, 6F and 6H, the voltage of the read bus RIO1 and the voltage of the read bus RIO2 are time-divisionally output to the read/write bus RWBS1 as shown in FIG. 6H.

Also, as shown in FIG. 6I, the control signal SDE1 is changed for every clock cycle, and accordingly, the control signal SDE1 completely synchronizes with the colci signal CLK. As a result, the voltage of the read/write bus RWBY is changed as shown in FIG. 6J.

Further, as shown in FIG. 6K, the control signal DLA is changed in response to clock cycles C5, C6, C7, . . . of the clock signal CLK. Therefore, the voltage of the read/write bus RWBY is latched by the data latch circuit 7. Then, the latched voltage of the data latch circuit 7 is output via the output enable circuit 8 as shown in FIG. 6L.

Thus, even in FIG. 5, a synchronous DRAM device having a CAS latency of 5 cycles can be realized. If the frequency of the clock signal CLK is 200 MHz, a time corresponding to an access time of a DRAM device is $$5 \times 5 \text{ ns} = 25 \text{ ns}. \tag{3}$$

Also, in the synchronous DRAM device of FIG. 5, since the number of the second stage data amplifiers is reduced as compared with that of FIG. 3, the chip area can be reduced, to increase the integration.

Figure 7:
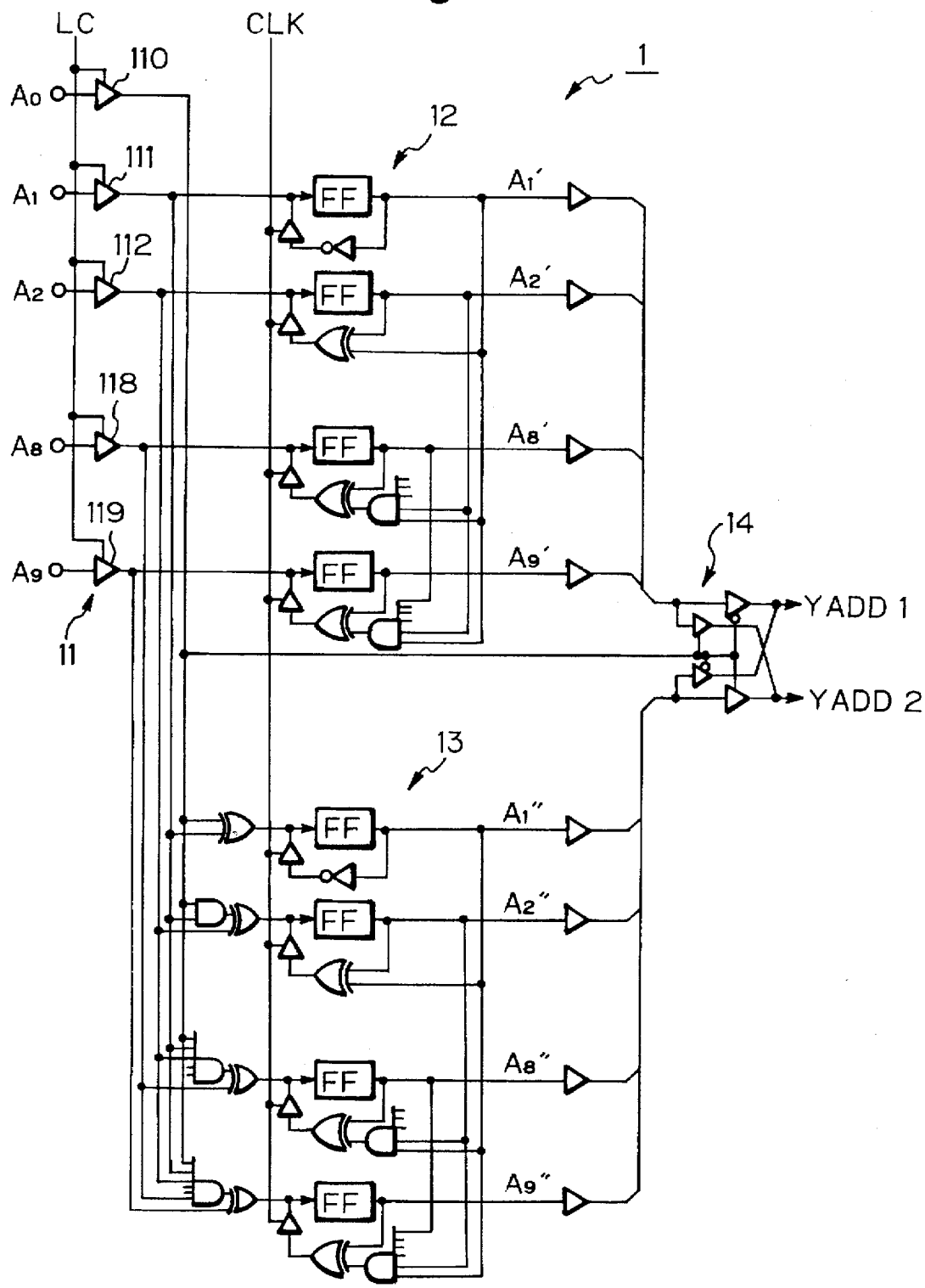
FIG. 7 is a circuit diagram of the column address buffer of FIGS. 3 and 5.

In FIG. 7, which is a detailed circuit diagram of the column address buffer 1 of FIGS. 3 and 5, a latch circuit 11 receives the latch control signal LC to latch a 10-bit external address designated by $A_0, A_1, \ldots, A_8$ and $A_9$. The latch circuit 11 is constructed by tri-state buffers 110, 111, . . . , 118 and 119. The external address latched by the latch circuit 11 is supplied to burst counters 12 and 13. The burst counters 12 and 13 are operated in response to the clock signal CLK. The output address $A_1', A_2', \ldots, A_9'$ of the burst counter 12 and the output address $A_1'', A_2'', \ldots, A_9''$ of the burst counter 13 are supplied as the address signals YADD1 and YADD2 via a gate circuit 14 in accordance with the external address bit $A_0$.

Figure 8:
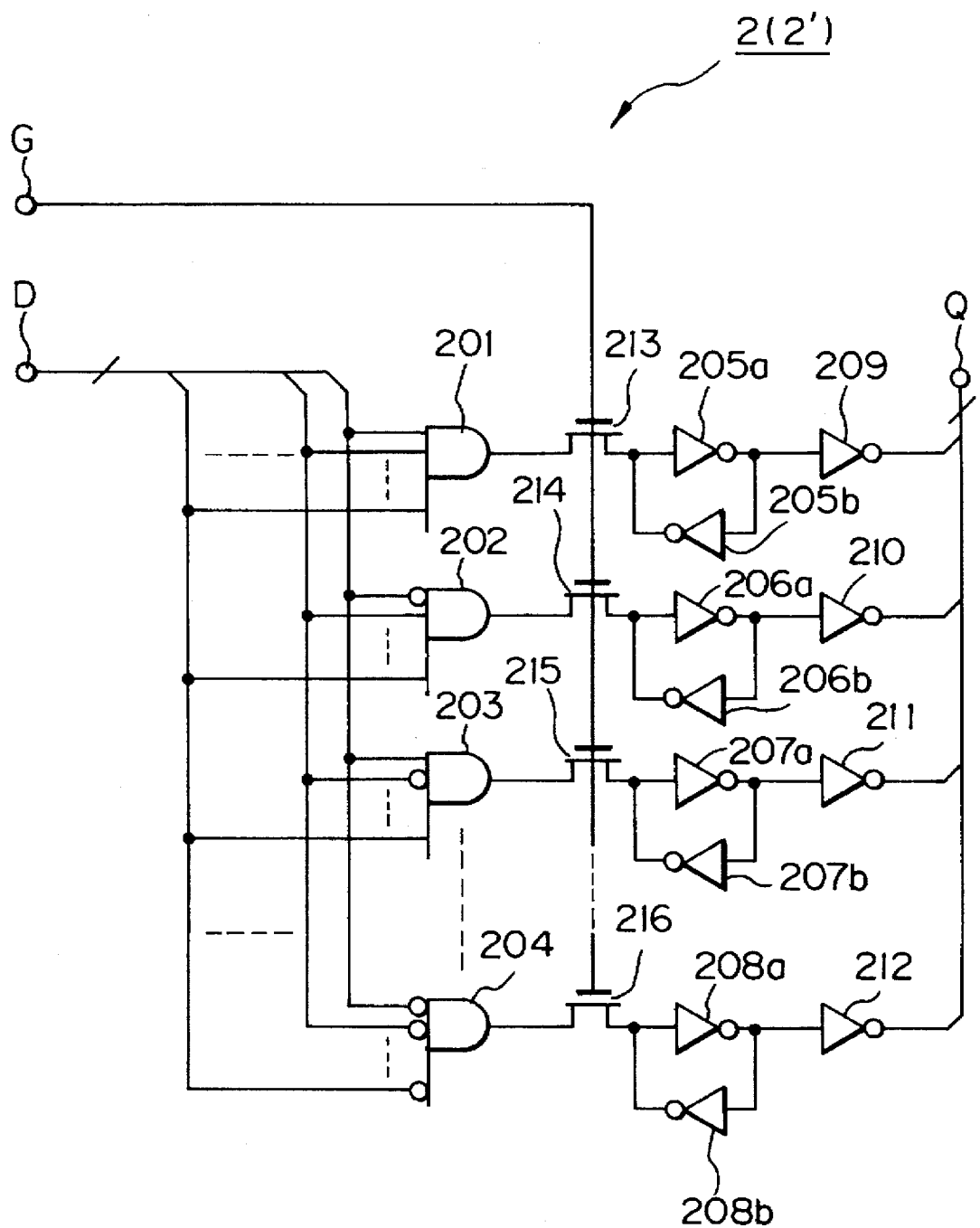
FIG. 8 is a circuit diagram of the column decoder of FIGS. 1, 3 and 5.

In FIG. 8, which is a detailed circuit diagram of the column decoder 2 (2') of FIGS. 1, 3 and 5, the column decoder 2 (2') includes gate circuits 201 through 204 for decoding a column address D, flip-flops formed by two inverters such as 205a and 205b for storing data, and inverters 209 through 212. Also, reference numerals 213 through 216 designate transfer gates for transmitting the outputs of the gate circuits 201 through 204 to the flip-flops in accordance with a control signal G.

Figure 9:
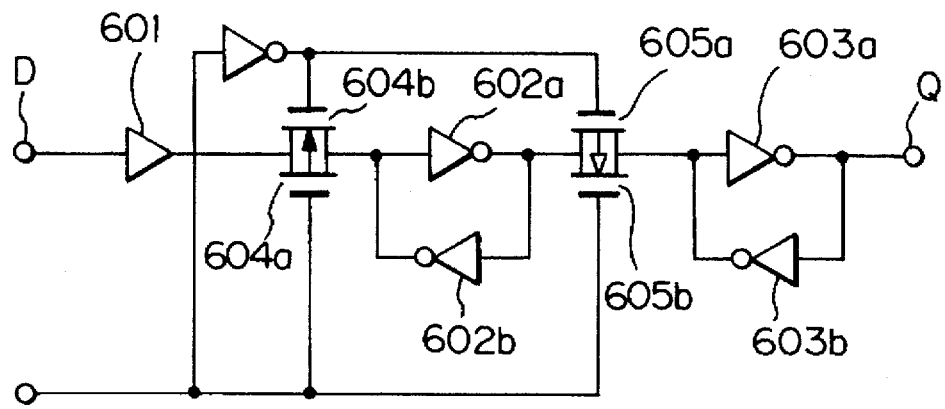
FIG. 9 is a circuit diagram of the second data amplifier of FIGS. 1, 3 and 5.

In FIG. 9, which is a detailed circuit diagram of the second data amplifier 6 (6') of FIGS. 1, 3 and 5, the second data amplifier 6 (6') includes a buffer 601 for amplifying data D, a master flip-flop (latch) formed by inverters 602a and 602b, and a slave flip-flop (latch) formed by inverters 603a and 603b. Also, provided between the buffer 601 and the master flip-flop is a first transfer gate formed by a P-channel MOS transistor 604a and an N-channel MOS transistor 604k controlled by a voltage at a terminal C. Further, provided between the master flip-flop and the slave flip-flop is a second transfer gate formed by a P-channel MOS transistor 605a and an N-channel MOS transistor 605b controlled by the voltage at the terminal C. In this case, the second transfer gate is turned on and OFF, when the first transfer gate is turned OFF and ON, respectively.

Figure 10:
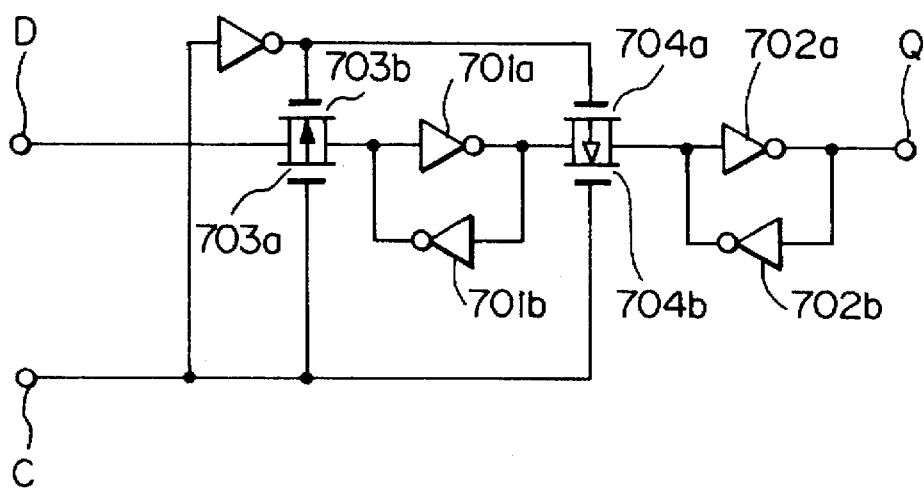
FIG. 10 is a circuit diagram of the data latch circuit of FIGS. 1, 3 and 5.

In FIG. 10, which is a detailed circuit diagram of the data latch circuit 7 of FIGS. 1, 3 and 5, the data latch circuit 7 includes a master flip-flop (latch) formed by inverters 701a and 701b, and a slave flip-flop (latch) formed by inverters 702a and 702b. Also, provided between a data terminal D and the master flip-flop is a first transfer gate formed by a P-channel MOS transistor 703a and an N-channel MOS transistor 703b controlled by a voltage at a terminal C. Further, provided between the master flip-flop and the slave flip-flop is a second transfer gate formed by a P-channel MOS transistor 704a and an N-channel MOS transistor 704b controlled by the voltage at the terminal C. In this case, the second transfer gate is turned On and OFF, when the first transfer gate is turned OFF and ON, respectively.

As explained hereinabove, according to the present invention, since the number of the second stage data amplifiers is reduced, the chip area can be reduced, thus increasing the integration. For example, the increase of the chip area is only 0.5 percent (about 0.6 m$^2$) as compared with the prior art synchronous DRAM device of FIG. 1.

I claim:

1. A synchronous dynamic semiconductor memory device comprising:

a column address buffer including burst counters and generating first and second series of address signals in synchronization with every two clock cycles of a clock signal;

a first column decoder, connected to said column address buffer, for decoding said first series of address signals in synchronization with every two clock cycles of said clock signal;

a second column decoder, connected to said column address buffer, for decoding said second series of address signals in synchronization with every two clock cycles of said clock signal;

a first sense amplifier, connected to said first column decoder, for amplifying a first data signal in accordance with a first column switch signal of said first column decoder and generating a voltage at a first read bus;

a second sense amplifier, connected to said second column decoder, for amplifying a second data signal in accordance with a second column switch signal of said second column decoder and generating a voltage at a second read bus;

a first first-stage data amplifier, connected to said first read bus, for amplifying the voltage of said first read bus and transmitting an amplified voltage of said first read bus to a read/write bus in synchronization with every two clock cycles of said clock signal;

a second first-stage data amplifier, connected to said second read bus, for amplifying the voltage of said second read bus and transmitting an amplified voltage of said second read bus to said read/write bus in synchronization with every two clock cycles of said clock signal, said second first-stage data amplifier being operated time-divisionally with said first first-stage data amplifier;

a second-stage data amplifier, connected to said read/write bus, for amplifying a voltage of said read/write bus in synchronization with every one clock cycle of said clock signal; and a data latch circuit, connected to said second-stage data amplifier, for latching an output of said second-stage data amplifier in synchronization with every one clock cycle of said clock signal to generate an output data signal.

2. The device as set forth in claim 1, wherein said first first-stage data amplifier is operated in accordance with a control signal obtained by delaying a control signal for said first column decoder, said second first-stage data amplifier being operated in accordance with a control signal obtained by delaying a control signal for said second column decoder.

said second-stage data amplifier being operated on accordance with a control signal in synchronization with said clock signal.

3. A synchronous dynamic semiconductor memory device, comprising:

a column address buffer having burst counters function and a plurality of outputs;

a plurality of data paths, each connected to one of the outputs of said column address buffer, each of said data paths including a series of a column decoder, a sense amplifier and a first-stage data amplifier;

a read/write bus connected to said data paths;

a second-stage data amplifier connected to said read/write bus; and a data latch circuit connected to said second-stage amplifier, said data paths being operated in synchronization with every two clock cycles of a clock signal, said second-stage data amplifier and said data latch circuit being operated in synchronization with every one clock cycle of said clock signal.

4. The device as set as set forth in claim 3, wherein said first-stage data amplifiers of each of said data paths are operated time-divisionally with each other.

* * * * *